United States Patent
Iwasa et al.

(10) Patent No.: US 10,079,092 B2
(45) Date of Patent: *Sep. 18, 2018

(54) HIGH-TEMPERATURE SUPERCONDUCTING HIGH-CURRENT DEVICES COMPENSATED FOR ANISOTROPIC EFFECTS

(71) Applicant: Massachusetts Institute of Technology, Cambridge, MA (US)

(72) Inventors: Yukikazu Iwasa, Weston, MA (US); Juan Bascuñán, Burlington, MA (US); Seungyong Hahn, Chestnut Hill, MA (US)

(73) Assignee: Massachusetts Institute of Technology, Cambridge, MA (US)

(*) Notice: Subject to any disclaimer, the term of this patent is extended or adjusted under 35 U.S.C. 154(b) by 347 days.

This patent is subject to a terminal disclaimer.

(21) Appl. No.: 14/952,327

(22) Filed: Nov. 25, 2015

(65) Prior Publication Data

US 2016/0240286 A1   Aug. 18, 2016

Related U.S. Application Data

(63) Continuation-in-part of application No. 14/620,260, filed on Feb. 12, 2015.

(51) Int. Cl.
   *H01B 12/00*    (2006.01)
   *H01F 41/04*    (2006.01)
   (Continued)

(52) U.S. Cl.
   CPC ............ *H01F 41/048* (2013.01); *H01F 6/06* (2013.01); *H01L 39/143* (2013.01);
   (Continued)

(58) Field of Classification Search
   CPC .................................. H01F 6/06; H01B 12/02
   See application file for complete search history.

(56) References Cited

U.S. PATENT DOCUMENTS 5,187,859 A   2/1993   Heim et al.
5,581,220 A   12/1996  Rodenbush et al.
(Continued)

FOREIGN PATENT DOCUMENTS

WO   1999007003 A1   2/1999

OTHER PUBLICATIONS

International Search Report and Written Opinion for PCT/US15/15803, dated Nov. 30, 2015.
(Continued)

*Primary Examiner* — Paul A Wartalowicz
(74) *Attorney, Agent, or Firm* — Peter A. Nieves; Sheehan Phinney Bass & Green PA

(57) ABSTRACT

High-temperature superconducting (HTS) devices and methods are disclosed. An HTS cable subassembly has a rectangular shaped cross section. The subassembly includes a stack of tapes formed of a superconducting material, and a cable subassembly wrapper wrapped around the stack of tapes. The tapes in the stack are slidably arranged in a parallel fashion. A cable assembly is formed of a cable assembly wrapper formed of a second non-superconducting material disposed around an n×m array of cable subassemblies. Within a cable assembly, a first cable subassembly of the array of subassemblies is oriented substantially perpendicular to a second cable subassembly with regard to the plurality of tapes. A compound-cable assembly is formed by joining two or more cable assemblies. A high-temperature superconducting magnet is formed of a solenoidal magnet as well as dipole and quadrupole magnets wound of a cable subassembly, a cable assembly, and/or a compound cable assembly.

19 Claims, 13 Drawing Sheets

(51) Int. Cl.
    *H01F 6/06*          (2006.01)
    *H02G 15/34*       (2006.01)
    *H01L 39/14*       (2006.01)
    *H01L 39/24*       (2006.01)

(52) U.S. Cl.
    CPC ......... *H01L 39/2419* (2013.01); *H02G 15/34* (2013.01); *Y02E 40/648* (2013.01)

(56) References Cited

U.S. PATENT DOCUMENTS

| | | |
|---|---|---|
| 2002/0142918 A1 | 10/2002 | Riley et al. |
| 2003/0162665 A1* | 8/2003 | Rokhvarger ........ H01L 39/2419 505/100 |
| 2008/0180202 A1 | 7/2008 | Otto et al. |
| 2010/0099570 A1* | 4/2010 | Takayasu ............... H01B 12/02 505/163 |

OTHER PUBLICATIONS

M. Takayasu, L. Chiesa, L. Bromberg, and J. V. Minervini; Cabling Method for High Current Conductors Made of HTS Tapes; IEEE Transactions on Applied Superconductivity, vol. 21, No. 3, Jun. 2011.

Makoto Takeyasu, Franco J. Mangiarotti, Luisa Chiesa, Leslie Bromberg, and Joseph V. Minervini; Conductor Characterization of YBCO Twisted Stacked-Tape Cables; IEEE Transactions on Applied Superconductivity, vol. 23, No. 3, Jun. 2013.

M. Takayasu, L. Chiesa, L. Bromberg, and J.V. Minervini; Cabling Method for High Current Conductors Made of HTS Tapes; IEEE Transactions of Applied Superconductivity, vol. 21, No. 3, Jun. 2011.

Makoto Takeyasu, Franco J. Mangiarotti, Luisa Chiesa, Leslie Bromberg, and Joseph V. Minervini; Conductor Characterization of YBCO Twisted Stacked-Tape Cables, IEEE Transactions on Applied Superconductivity, vol. 23, No. 3, Jun. 2013.

* cited by examiner

HIGH-TEMPERATURE SUPERCONDUCTING HIGH-CURRENT DEVICES COMPENSATED FOR ANISOTROPIC EFFECTS

CROSS-REFERENCE TO RELATED APPLICATIONS

This application is a continuation-in-part of U.S. patent application Ser. No. 14/620,260, filed Feb. 12, 2015, entitled "High-Temperature Superconducting High-Current Cables," which is incorporated by reference herein in its entirety.

FIELD OF THE INVENTION

The present invention relates to electro-magnetics, and more particularly, is related to high temperature superconductors.

BACKGROUND OF THE INVENTION

Prior art high-temperature superconductors (HTS), particularly Bi-2223 (Bismuth strontium calcium copper oxide $Bi_2Sr_2Ca_2Cu_3O_{10+x}$) and REBCO (rare-earth barium-copper-oxide) or RE-123 superconductors, are available as a single tape conductor with a maximum width for REBCO of either 10 mm or 12 mm with a critical current at 77 K in self field (s.f.) at the present time of no greater than approximately 500 A.

HTS cables have been developed for applications such as electric power lines, particularly with Bi-2223. Two prior art HTS power transmission cables are shown in FIGS. 1A and 1B. Development of REBCO cables is also underway. These cables target a current level of approximately 10 kA. These cables may include many Bi-2223 or REBCO tapes, each of which is rotated (twisted) along the cable length, as shown in FIGS. 1A and 1B. FIG. 1A depicts a cable formed of a single twisted tape, while FIG. 1B depicts a cable formed of a stack of tapes twisted around a longitudinal axis. REBCO is highly anisotropic: if the tape wide surface is exposed to a magnetic field perpendicular to its surface, the critical current at a given temperature is substantially smaller than if the field is parallel. Since standard cable formations expose the tape wide surface to the highest magnetic field impinging on the cable, such cables cannot be used to wind a magnet generating above 1 T. The anisotropy data of an exemplary REBCO superconductor tape is shown in FIG. 2.

FIG. 2 (prepared by SuperPower, Inc.) shows ratios of critical current with the magnetic field normal (parallel to the REBCO c-axis) to tape surface, $I_c$ (H//c or B//c), to critical current with field parallel to tape surface, $I_c$, vs. magnetic field [T] plots, at selected temperatures for the exemplary REBCO superconductor tape manufactured by SuperPower, Inc. Note that as the temperature increases, the ratio of critical current with the magnetic field normal (to tape surface precipitately drops with the magnetic field.

Since HTS power transmission cables are readily available, prior art HTS magnets have generally employed coils (solenoidal magnets) of HTS cable. However, as noted above, the current-carrying capacity of power transmission cables are inherently limited due to the geometry of their physical configuration, particularly when employed in a solenoidal magnet configuration. In addition, HTS power transmissions may not be optimal for use in prior art HTS magnets since they are generally not designed to achieve maximum or uniform current density. Therefore, there is a need in the industry to overcome one or more of the above mentioned shortcomings.

SUMMARY OF THE INVENTION

Embodiments of the present invention provide high-temperature superconducting high-current cables. Briefly described, the present invention is directed to a high-temperature superconducting (HTS) cable subassembly having a rectangular shaped cross section. The subassembly includes a stack of HTS tapes formed of a superconducting material, and a cable subassembly wrapper wrapped around the stack of tapes. The tapes in the stack are slidably arranged in a parallel fashion. A cable assembly is formed of a cable assembly wrapper formed of a second non-superconducting material disposed around an n×m array of cable subassemblies. Within a cable assembly, a first cable subassembly of the array of subassemblies is oriented substantially perpendicular to a second cable subassembly with regard to the plurality of tapes. A compound cable assembly is formed by joining two or more cable assemblies. A high-temperature superconducting magnet is formed of a solenoid formed of a cable subassembly, a cable assembly, and/or a compound cable assembly.

Other systems, methods and features of the present invention will be or become apparent to one having ordinary skill in the art upon examining the following drawings and detailed description. It is intended that all such additional systems, methods, and features be included in this description, be within the scope of the present invention, and protected by the accompanying claims.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principals of the invention.

DETAILED DESCRIPTION

Figures 1A, 1B:
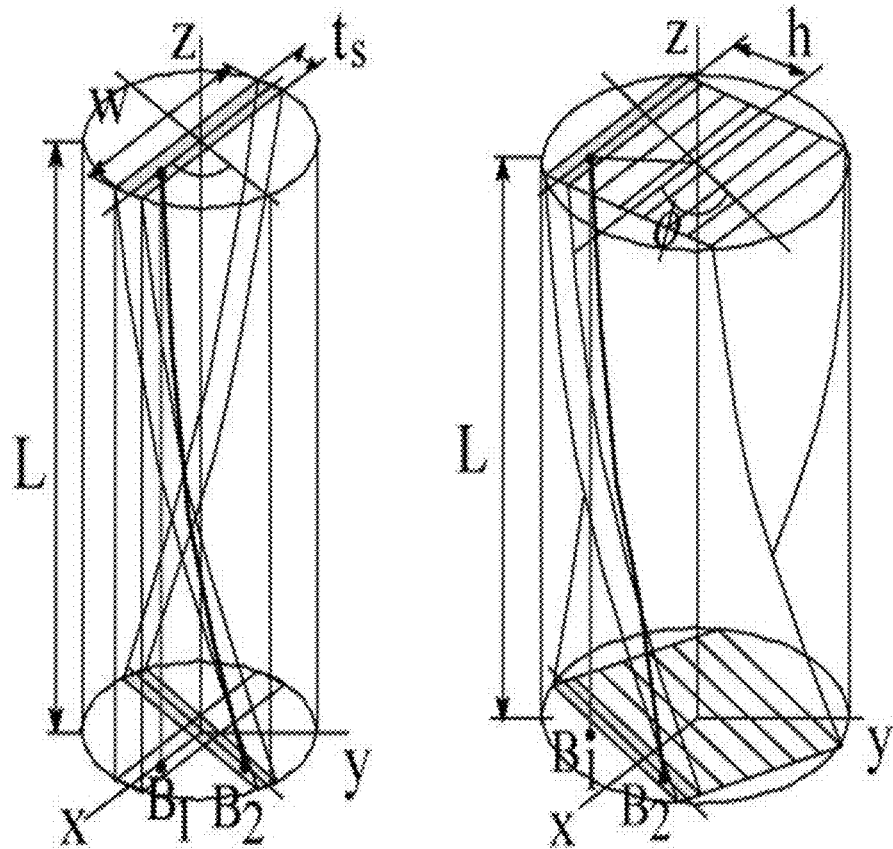
FIG. 1A is a schematic diagram of a section of a first prior art HTS power transmission cable.
FIG. 1B is a schematic diagram of a section of a second prior art HTS power transmission cable.
Figure 2:
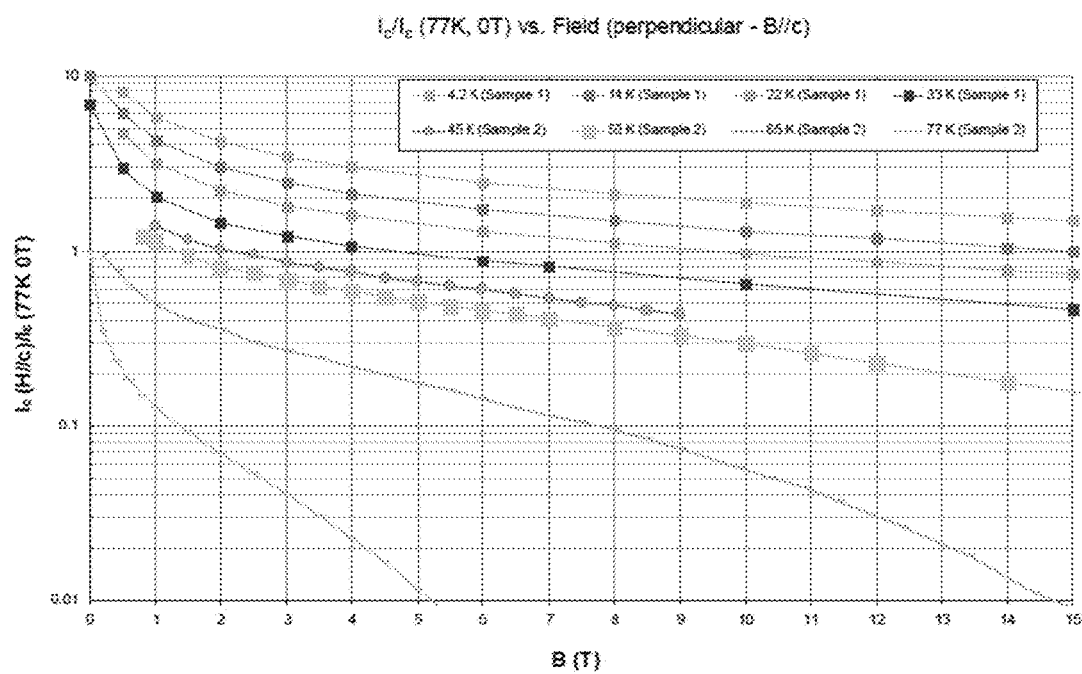
FIG. 2 is a schematic chart of anisotropy data of a prior art REBCO superconducting tape (manufactured by Super-Power Inc.) showing plots at selected temperatures of the ratio of critical current, Ic, exposed to H//c (or B//c), a magnetic field parallel to the c-axis (normal to tape surface), to the 77-K critical current in zero magnetic field (0 T).

Reference will now be made in detail to embodiments of the present invention, examples of which are illustrated in the accompanying drawings. Wherever possible, the same reference numbers are used in the drawings and the description to refer to the same or like parts.

As used within this disclosure, the term "tape" refers to a long, thin, flat superconducting material. While the term "tape" may be used to refer to a single wide, flat length of superconducting material, "tape" may also be used to refer to a construct joining of two or more tape portions to form an aggregate tape, for example, two tape portions joined end to end with a connection area, for example, a spliced abutted end connection or an overlapping joint connection. A tape may also be formed by joining two or more tape narrower portions side-by-side to form a wider tape. A tape formed by joining two or more tape portions of other configurations is also possible.

As used within this disclosure, "substantially" means "very nearly." For example, two or more substantially equal sized objects refer to objects having the same dimensions, excepting minor or negligible variations, for example, within manufacturing tolerances. Objects described as substantially equal in size may therefore be exactly equal, or within a small degree of being exactly equal.

As mentioned above, there is a need in the industry for a high-temperature superconducting high-current (HTS-HC) cable better suited for use in a high-field magnet than prior art power transmission cables, for example, a single Bi-2223 or REBCO cable. This invention addresses HTS-HC cables as applicable to a high-field magnet such as a single Bi-2223 or REBCO cables.

Figure 3:
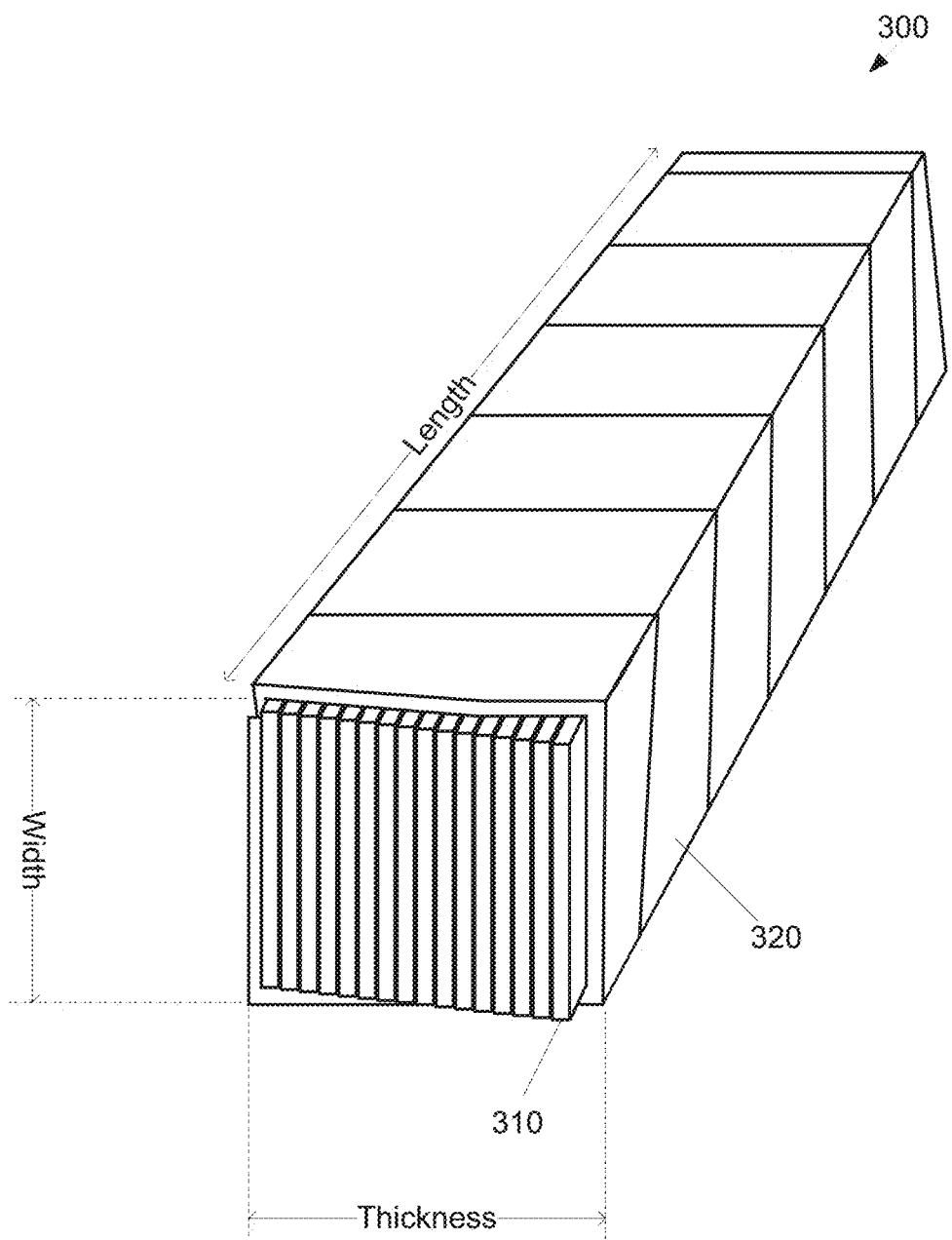
FIG. 3 is a schematic diagram showing a first exemplary embodiment of a high-temperature superconducting high-current (HTS-HC) cable.

A first exemplary embodiment of a HTS-HC cable is a cable subassembly 300 as shown in FIG. 3. The subassembly cable 300 may be used as a basis component for forming other cables (described below), and is therefore referred to herein as a cable subassembly. However, there is no objection to use of a single cable subassembly 300 as a stand-alone high-temperature superconducting cable in some applications.

The cable subassembly 300 includes a plurality of tapes 310 formed of a material suitable for high-temperature superconducting purposes, for example, Bi-2223 or REBCO. Each tape 310 (FIG. 3) of the plurality of tapes may be of substantially the same dimensions, each tape 310 having a tape length, a first face and an opposing second face of a tape width, and a first edge and a second edge having a tape thickness. The plurality of 310 tapes is (?) stacked in parallel fashion such that the tapes 310 in the stack are arranged face-to-face with aligned first and second edges. The aggregate thickness of the stack of tapes 310 is approximately equal to the cable subassembly 300 width less the thickness of a cable subassembly wrapper 320, and the width of the stack of tapes 310 is approximately equal to the width of the cable subassembly 300 plus the thickness of the cable subassembly wrapper 320. The cable subassembly 300 has a subassembly length substantially equal to the lengths of each of the tapes 310 in the tape stack.

While the cable subassembly 300 shown in FIG. 3 depicts a stack of tapes 310 having sixteen tapes, other stack sizes are possible. An exemplary stack of tapes 310 may include, for example, ten or fewer tapes to one hundred or more tapes, each tape 310 having, for example, a width in the range of 1-12 mm, and a thickness of 65-95 µm. Of course, other exemplary tape stacks may be formed of different numbers of tapes 310 having quantities and dimensions not limited by the previous example.

The subassembly wrapper 320 is wrapped around the stack of tapes 310, for example, with windings of a wrapper material forming the subassembly wrapper 320 wound in a helical fashion around the cable subassembly 300 for substantially the length of the cable subassembly 300. The subassembly wrapper 320 may be formed of wire or tape wrapping material formed of a conducting material, for example, copper, or a non-conducting or insulating material, for example, stainless steel. In the first embodiment, the subassembly wrapper 320 is not formed of a superconducting material. The windings of the subassembly wrapper 320 may overlap, may abut, or may have a gap between successive windings. Other subassembly wrapper 320 configurations are also possible, for example, a braided wire or tape wrapping. The subassembly wrapper 320 may be relatively thin with respect to the dimensions of the tapes 310, for example, a subassembly wrapper 320 formed of copper on the order of 25 µm thick.

In a preferred embodiment, the tapes 310 in the cable subassembly 300 stack are not soldered together or otherwise adhered to one another, so that each tape 310 may have a limited sliding range with respect to adjacent tapes 310 to facilitate bending of the cable subassembly 300, for example, when bending the cable subassembly 300 to form a coil. Similarly, the subassembly wrapper 320 may not be soldered or otherwise attached to the stack of tapes 310 to further facilitate bending and/or winding the cable subassembly 300. The orientation of the stack of tapes 310 may facilitate less resistance to bending in a plane parallel to the tape faces than in a plane perpendicular to a the tape faces.

The cable subassembly 300 may be described in terms of its length, and the width and thickness of a cross-section of the cable subassembly 300. Thickness of the cable subassembly 300 is measured with respect to the height of the stack of tapes 310. Unlike the prior art cables of FIGS. 1A and 1B, the cable subassembly 300 is not substantially twisted along its longitudinal axis.

In accordance with co-pending application Ser. No. 13/919,164, entitled "Partial Insulation Superconducting Magnet," incorporated herein by reference in its entirety, the cable subassembly 300 may be formed with no insulation between the tapes 310, and/or no insulation between the stack of tapes 310 and the subassembly wrapper 320. Embodiments of a cable subassembly 300 formed without insulation between adjacent stacked tapes 310 and/or between the stacked tapes 310 and the subassembly wrapper 320 are referred to herein as a no-insulation embodiment of a cable subassembly 300.

In a no-insulation embodiment of a cable subassembly 300, the critical current $I_c$ of the cable subassembly 300 may approximately the sum of the critical currents of each of the tapes 320 in the plurality of tapes 310 forming the stack, depending upon the anisotropic effect, as described further below. For example, a no-insulation cable subassembly 300 with twenty one stacked tapes 310 where each tape has an $I_c$ of 60 A at 77 K, s.f. (self field), has an aggregate critical current of 1260 A at 77 K, s.f. If an individual tape 310 in the plurality of tapes 310 has a lower $I_c$, for example, due to a material irregularity or a manufacturing defect, the aggregate $I_c$ of the cable subassembly 300 is minimally affected, as the lack of insulation between the stacked tapes 310 provides a conducting path to distribute the current across the remaining tapes 310.

In contrast, in a cable subassembly 300 having insulation between the individual tapes 310 in the stack, one or more defective tapes 310 having a lower $I_c$ results in the aggregate $I_c$ of the cable subassembly 300 being lowered accordingly, as the insulation between the stacked tapes 310 inhibits a conducting path from distributing the current across the remaining tapes 310 in the cable subassembly 300.

Figure 4:
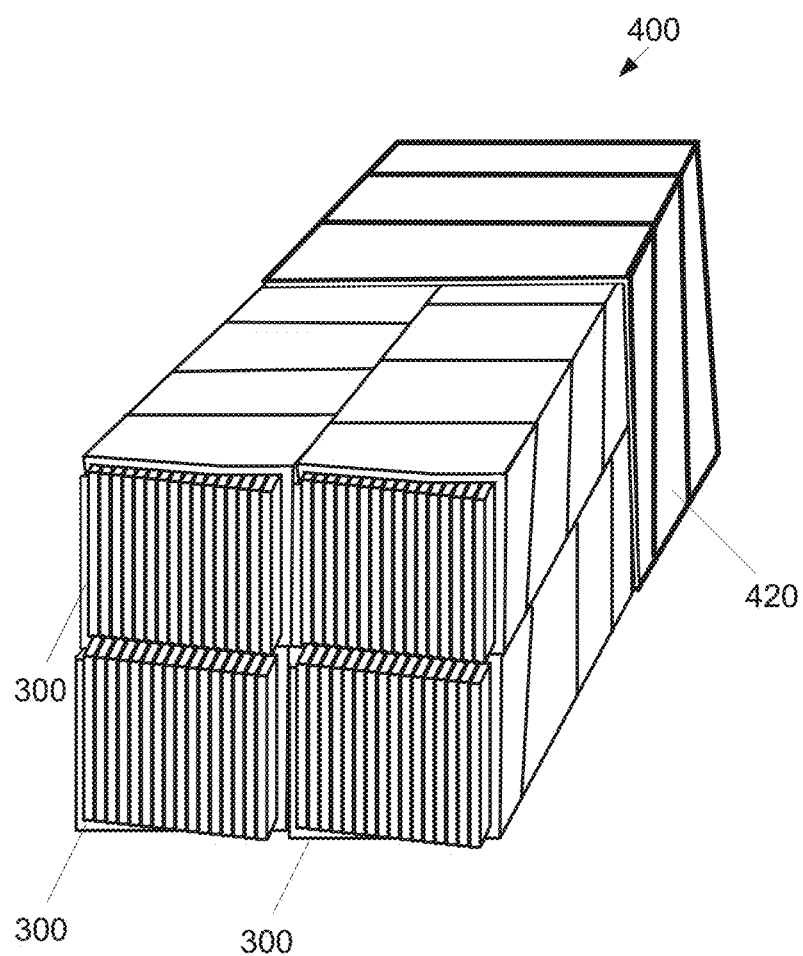
FIG. 4 is a schematic diagram of a second exemplary embodiment of an HTS-HC cable assembly, assembled from 4 HTS-HC cable subassemblies, shown in FIG. 3.

FIG. 4 shows a second exemplary embodiment of a HTS-HC cable, cable assembly 400. The cable assembly 400 is formed of two or more cable subassemblies 300. The cable subassemblies 300 are grouped together so the cable assembly 400 has a rectangular cross section of cable subassemblies 300 arranged in an m×n array, where m and n are positive integers. For example, the cable assembly 400 shown in FIG. 4 has a rectangular cross section of 2×2 cable subassemblies 300.

An assembly wrapper 420 is wrapped around the array of cable subassemblies 300, for example, with windings of the assembly wrapper material wound in a helical fashion around the cable assembly 400 for substantially the length of the cable assembly 400. It should be noted that FIG. 4 depicts only a portion of the cable assembly 400 being wrapped with an assembly wrapper 420 for illustrative purposes only.

The cable assembly wrapper 420 may be formed of wire wrapping or tape wrapping material formed of a conducting material, for example, copper, or a non-conducting or insulating material, for example, stainless steel. In the second embodiment, the cable assembly wrapper 420 is not formed of a superconducting material. The windings of the cable assembly wrapper 420 may overlap, may abut, or there may be a gap between successive windings. Other wrapping configurations are also possible, for example, a braided wire wrapping or tape wrapping. The cable assembly wrapper 420 may be relatively thin, for example, a formed of copper on the order of 25-μm thick.

Under the second embodiment, the cable subassemblies 300 are arranged so that the tapes 310 (FIG. 3) within each of the cable subassemblies 300 within the cable assembly 400 are similarly oriented with respect to one another. In a preferred embodiment, the cable subassemblies 300 in the cable assembly 400 are not soldered together or otherwise adhered to one another, so that each cable subassembly 300 may have a limited sliding range with respect to adjacent cable subassemblies 300 to facilitate bending of the cable assembly 400, for example, when bending the cable assembly 400 to form a coil. Similarly, the assembly wrapper 420 may not be soldered or otherwise attached to the cable subassemblies 300 to further facilitate bending and/or winding the cable assembly 400. As noted above, the orientation of each of the stacks of tapes 310 (FIG. 3) within each cable subassembly 300 may facilitate less resistance to bending in a plane parallel to the tape faces than in a plane perpendicular to the tape faces.

The cable assembly 400 may be formed with no insulation between the cable subassemblies 300, or between the cable subassemblies 300 and the cable assembly wrapper 420. Embodiments of a cable assembly 400 formed without insulation between adjacent cable subassemblies 300 and/or between the cable subassemblies 300 and the cable assembly wrapper 420 are referred to herein as a no-insulation embodiment of a cable assembly 400. In general, a no insulation embodiment of a cable assembly 400 is made with cable subassemblies likewise made with no insulation.

In a no-insulation embodiment of a cable assembly 400, the critical current $I_c$ of the assembly 400 may be given approximately by the sum of the critical currents of each of the cable subassemblies 300 forming the cable assembly 400. For example, a no-insulation cable assembly 400 with four cable subassemblies 300 where each cable subassemblies 300 has an $I_c$ of 1260 A at 77 K, s.f. has an aggregate critical current of 5040 A at 77 K, s.f, not accounting for anisotropic effects.

Combining cable subassemblies 300, where each cable subassembly has a rectangular shaped cross section, yields a cable assembly 400 having less void spaces than a cable assembly combining cable subassemblies of another shaped cross-section, for example a circular shaped cross-section, or a cable formed of twisted tape (FIG. 1A) or a twisted tape stack (FIG. 1B). As a result, the cable assembly 400 formed of rectangular cable subassemblies 300 may have a higher current density than a cable assembly formed of cable subassemblies having another shaped cross-section.

Figure 5A:
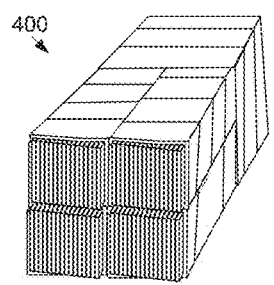
FIG. 5A is a schematic diagram of a 2×2 implementation of the second exemplary embodiment of an HTS-HC cable.
Figure 5B:
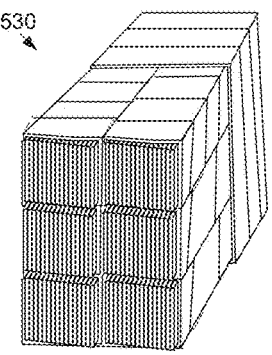
FIG. 5B is a schematic diagram of a 2×3 implementation of the second exemplary embodiment of an HTS-HC cable.
Figure 5C:
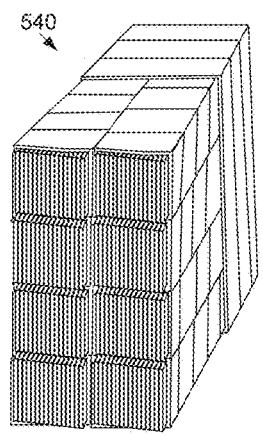
FIG. 5C is a schematic diagram of a 2×4 implementation of the second exemplary embodiment of an HTS-HC cable.
Figure 5D:
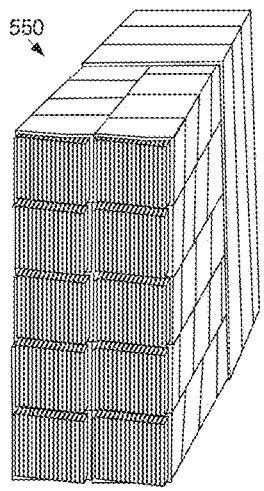
FIG. 5D is a schematic diagram of a 2×5 implementation of the second exemplary embodiment of an HTS-HC cable.
Figure 5E:
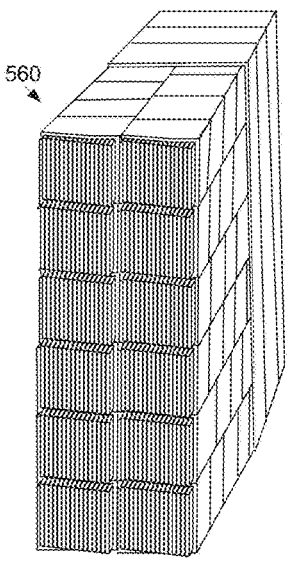
FIG. 5E is a schematic diagram of a 2×6 implementation of the second exemplary embodiment of an HTS-HC cable.

FIG. 5A shows the 2×2 cable assembly 400 described above. FIG. 5B shows an alternative embodiment of a cable assembly 530 with a 2×3 configuration of cable subassemblies 300 (FIG. 3). FIG. 5C shows an alternative embodiment of a cable assembly 540 with a 2×4 configuration of cable subassemblies 300 (FIG. 3). FIG. 5D shows an alternative embodiment of a cable assembly 550 with a 2×5 configuration of cable subassemblies 300 (FIG. 3). FIG. 5E shows an alternative embodiment of a cable assembly 560 with a 2×6 configuration of cable subassemblies 300 (FIG. 3). While each of these depicts a configuration of an m×n configuration of cable subassemblies 300 with m=2, other alternative embodiments may have other values of m, including, but not limited to 1, 3, 4, 5, 6, and higher.

Similarly, alternative embodiments may have other values of n than depicted in FIGS. 5A-5E, including 1, 7, 8, 9, 10, and higher.

The superconducting capacity of a cable assembly 400 increases according to the number of subassemblies 300 used in the cable assembly 400. However, the superconductor capacity may not increase proportionally according to the number of subassemblies 300 being used, due to capacity degradation by anisotropy of the magnetic field, particularly when the cable assembly 400 is formed into a solenoid. The anisotropic effect may be mitigated somewhat by using a subassembly 600 according to a third embodiment of a HTS-HC, shown in FIGS. 6A-6C. As noted above, the strong magnetic field is substantially parallel to the wide surface of the superconducting tape. The magnetic field impinges upon the superconductor perpendicular to the wide surface, reducing the carrying capacity of the superconductor tape.

Figure 6A:
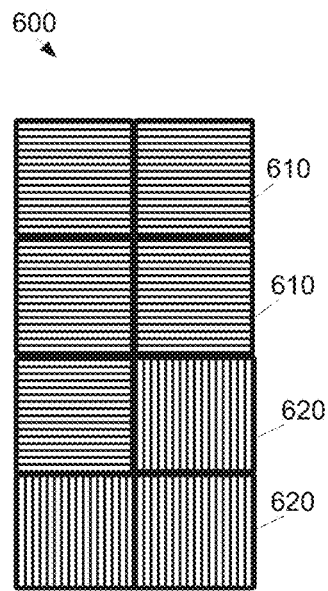
FIG. 6A is a first front-view schematic diagram of a third embodiment of a cable assembly with horizontally and vertically oriented cable subassemblies.
Figure 6B:
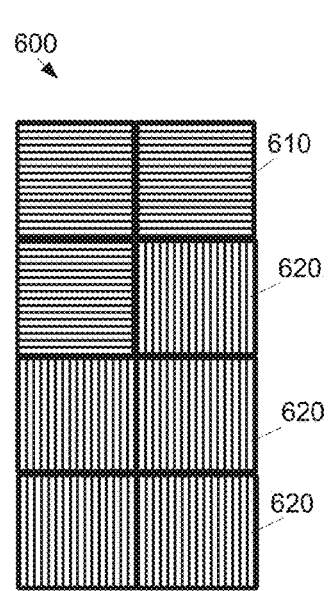
FIG. 6B is a second front-view schematic diagram of a third embodiment of a cable assembly with horizontally and vertically oriented cable subassemblies.
Figure 6C:
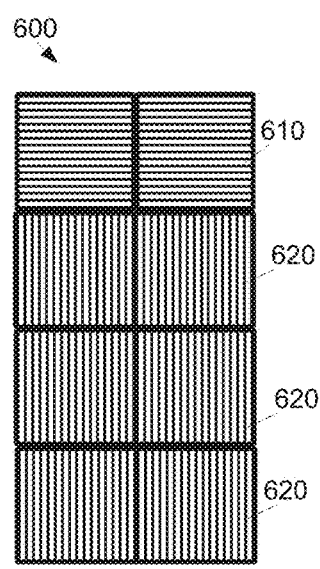
FIG. 6C is a third front-view schematic diagram of a third embodiment of a cable assembly with horizontally and vertically oriented cable subassemblies.

As shown by FIGS. 6A-6C, under the third embodiment, a cable assembly 600 may include multiple cable subassemblies 610, 620 having two distinct orientations with respect to the superconductor tapes. Cable subassemblies 620 include tapes that are parallel to a desired bending plane, for example, bending in the direction to accommodate winding a magnet coil, and cable subassemblies 610 that are perpendicular to the desired bending plane. Here, the subassemblies 610 with tapes perpendicular to the desired bending plane are referred to as horizontal subassemblies 610, while the subassemblies 620 with tapes parallel to the desired bending plane are referred to as vertical subassemblies 620.

By including a combination of horizontal cable subassemblies 610 and vertical cable subassemblies 620 in a cable assembly 600, the anisotropic effect may be reduced in comparison with a cable assembly 540 (FIG. 5C) formed entirely of vertical subassemblies 620, thereby increasing the superconducting current capacity. In particular, in a multi-width magnet formed of coils of cable assemblies 600, it may be desirable to have first cable assemblies 600 having a first configuration of horizontal and vertical cable subassemblies 610, 620 positioned at the center of the magnet, and second cable assemblies 600 having a second configuration of horizontal and vertical cable subassemblies 610, 620 positioned at the top and bottom of the magnet. The appropriate selection of vertical and horizontal cable subassemblies 610, 620 in a cable assembly 600 may allow for replacing cable assemblies 560 (FIG. 5E) having cable subassemblies 300 (FIG. 3) with a single tape orientation with a cable assembly 600 having fewer overall cable subassemblies 610, 620 with dual tape orientations, for example, by providing additional superconducting capacity by reducing the anisotropic effect. Magnets may be formed with one, two, three, or more configurations of cable assemblies 600.

FIG. 6A shows a cable assembly 600 having a 4×2 cross sectional array of cable subassemblies 610, 620, with three vertical subassemblies 620 and five horizontal cable subassemblies 610. FIG. 6B shows a cable assembly 600 having a 4×2 cross sectional array of cable subassemblies 610, 620, with five vertical subassemblies 620 and three horizontal cable subassemblies 610. FIG. 6C shows a cable assembly 600 having a 4×2 cross sectional array of cable subassemblies 610, 620, with six vertical subassemblies 620 and two horizontal cable subassemblies 610. A person having ordinary skill in the art will recognize that a cable assembly 600 may be formed of many other cable subassembly array configurations, and many other combinations and arrangements of vertical cable subassemblies 620 and horizontal cable subassemblies 610.

Figure 6D:
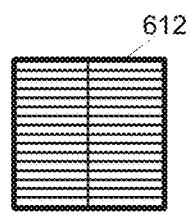
FIG. 6D is a front-view schematic diagram of a cable subassembly with two side-by-side tapes.
Figure 6E:
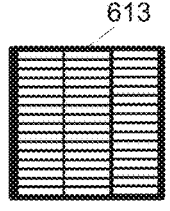
FIG. 6E is a front-view schematic diagram of a cable subassembly with three side-by-side tapes.
Figure 6F:
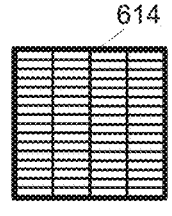
FIG. 6F is a front-view schematic diagram of a cable subassembly with four side-by-side tapes.

A person having ordinary skill in the art will recognize that vertical cable subassemblies 620 may be more conducive to bending in the plane parallel to the tapes in the vertical cable subassemblies than horizontal cable subassemblies 610, for example, to form coils from the cable assembly 600. To lower bending resistance, the horizontal subassemblies 610 may be formed using an alternative cable subassembly 612, as shown in FIG. 6D. In the alternative cable subassembly 612, two partial width tapes are used in place of a full width tape, for example, two half width tapes. For example, the full tape width of the cable subassembly 612 is made up of the two side-by-side tape segments, the combined width of each side-by-side tape segment being substantially the same as the full tape width. In alternative embodiments, two, three or more partial width tapes may be used in place of a full width tape, for example, three third-width tapes are used in the cable subassembly 613 as shown in FIG. 6E, and four quarter-width tapes are used in the cable subassembly 614 as shown in FIG. 6F. Other configurations are also possible, where the full tape width is made up of at least two side-by-side tape segments, the combined width of each side-by-side tape segment being substantially the same as the full tape width. Depending upon the orientation of the magnets and desired plane of bending, horizontal cable subassemblies 610 and/or vertical cable subassemblies 620 may be formed of side-by-side tape segments.

Figure 11A:
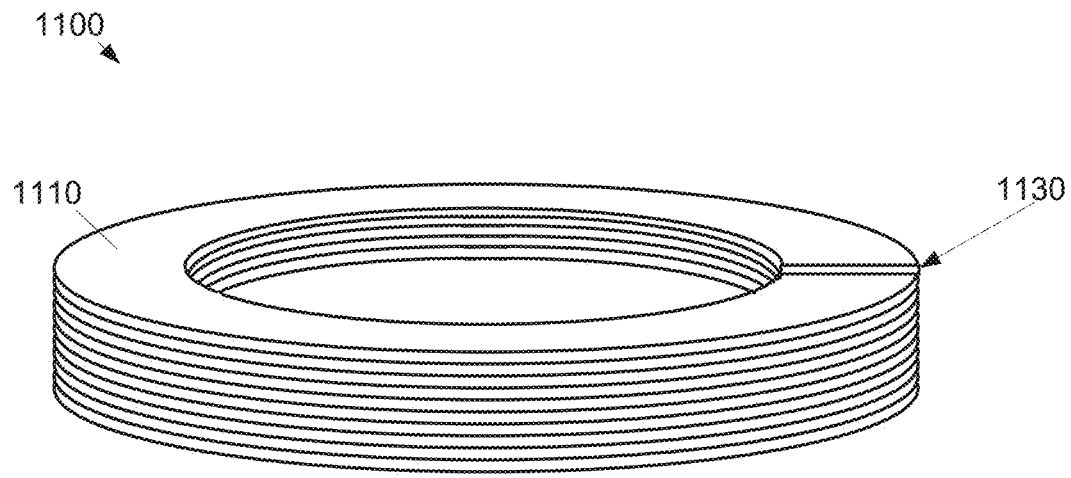
FIG. 11A is a schematic drawing showing an exemplary ring shaped cable subassembly without a wrapper.
Figure 11B:
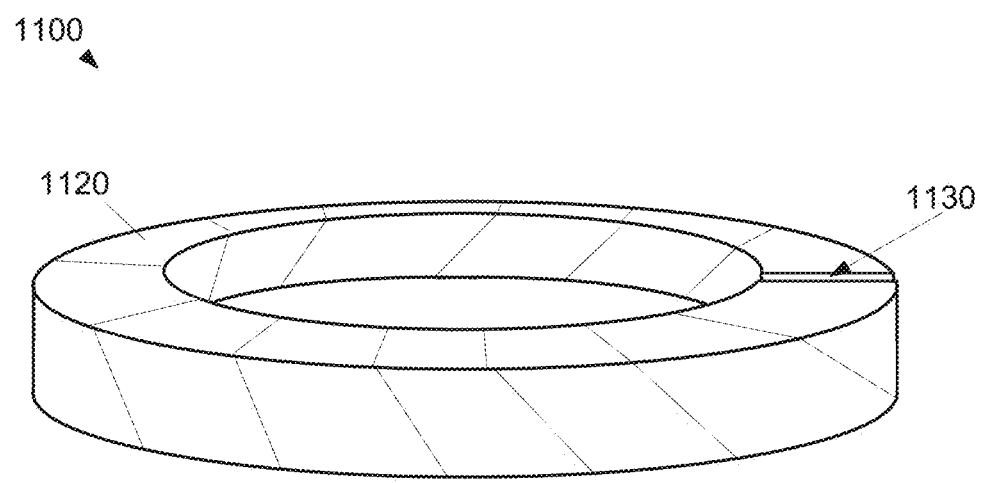
FIG. 11B is a schematic drawing showing an exemplary ring shaped cable subassembly with the wrapper.

In an alternative embodiment shown in FIGS. 11A-11B, a horizontal cable subassembly 1100 may be formed of stacked arcs or rings of superconducting tape 1110, rather than stacked rectangular tapes. The rings/arcs 1110 may have a gap 1130 or opening. The stack of tapes 1110 is wrapped with a wrapper 1120 to form the cable subassembly 1100. The rings of tape 1110 may be formed according to the desired size/shape of a magnet coil.

The subassembly wrapper 1120 is wrapped around the stack of tapes 1110, for example, with windings of a wrapper material forming the subassembly wrapper 1120 wound in a helical fashion around the cable subassembly 1100 for substantially the length of the cable subassembly 1100. The subassembly wrapper 1120 may be formed of wire or tape wrapping material formed of a conducting material, for example, copper, or a non-conducting or insulating material, for example, stainless steel. In the shown embodiment, the subassembly wrapper 1120 is not formed of a superconducting material. The windings of the subassembly wrapper 1120 may overlap, may abut, or may have a gap between successive windings. Other subassembly wrapper 1120 configurations are also possible, for example, a braided wire or tape wrapping. The subassembly wrapper 1120 may be relatively thin with respect to the dimensions of the tapes 1110, for example, a subassembly wrapper 1120 formed of copper on the order of 25 μm thick.

A cable assembly 600 (FIG. 6A) may be formed by a combination of horizontal ring/arc cable subassemblies 1100 and vertical cable subassemblies 620 (FIG. 6A). For an m×n cable assembly 600 where n>1, concentric inner and outer horizontal ring/arc cable subassemblies 1100 may be formed using tape rings/arcs having different radii. For example, the outer radius of an inner concentric horizontal ring/arc cable subassembly 1100 may be substantially equal to the inner radius of an outer concentric horizontal ring/arc cable subassembly 1100.

FIGS. 9A-9E show an exemplary embodiment of a joint between two cable assemblies 540, each cable assembly 540 formed from a 2×4 configuration of cable subassemblies 300 (FIG. 3). FIG. 10 is a flowchart describing an exemplary method for joining two cable assemblies 540. As shown by block 1010, one end of a first cable assembly 540 for a finger joint formed by extending alternating cable subassemblies 300. A second cable assembly 540 is similarly prepared for a finger joint, as shown by block 1020. A thick solder strip 920 is wrapped over each finger joint cable subassembly 300, as shown by block 1030 and FIG. 9B. The two assemblies 540 are brought together and the finger joints of the two cable assemblies 540 are interleaved, as shown by block 1040 and FIG. 9C. A thin wide wrapping 922, for example, a copper strip, is wrapped around the finger joint area, as shown by block 1050, and FIG. 9D. The wrapping 922 may be perforated, for example, on the top surface, to provide an ingress path for solder flow. A thick solder strip 925 is wrapped around the perforated copper wrapping 922, as shown by block 1060 and FIG. 9D. The joint area may then be heated to melt the solder of the solder strips 920, 925 and bond the joint 990, as shown by block 970 and FIG. 9E.

Persons having ordinary skill in the art will recognize there are many variations in joining two cable ends, or "fingers" different from those depicted in FIG. 9 that may be used. While FIGS. 9A-9E depicts the joining of two cable assemblies 540 having the same number of cable subassemblies 300, the methodology described above may also be applied to the joining of cable assemblies having different numbers of cable subassemblies 300. For example, a 4×2 cable assembly 540 may be joined with a 5×2 cable assembly (FIG. 5D). Other combinations are also possible.

A compound cable assembly 900 is formed by joining two or more cable assemblies 400 (FIG. 4), 530, 540, 550, 560 (FIG. 5), 600 (FIG. 6A). In general, for practical purposes, the compound cable assembly 900 is formed by a first cable assembly 400 (FIG. 4), 530, 540, 550, 560 (FIG. 5), 600 (FIG. 6A) and a second cable assembly 400 (FIG. 4), 530, 540, 550, 560 (FIG. 5), 600 (FIG. 6A), where the first and second cable assemblies each have the same number of cable subassemblies 300 (FIG. 3) 610, 620 (FIG. 6A), and similar configurations of cable subassemblies 300 (FIG. 3) 610, 620 (FIG. 6A). Other compound cable assemblies are also possible.

A superconducting magnet may be formed from coils formed of superconducting cable. Under a fourth exemplary embodiment of the current invention, a high-temperature superconducting magnet includes a coil formed of HTS-HC cable. The HTS-HC cable may be a cable subassembly 300 (FIG. 3), a cable assembly 400 (FIG. 4), or one of the cable assemblies 530, 540, 550, 560 (FIG. 5), 600 (FIG. 6A). The coil may be wound in a fashion similar to a prior art high-temperature superconducting magnet, for example, by forming the coil by winding the HTS-HC cable around a bobbin.

Figure 7A:
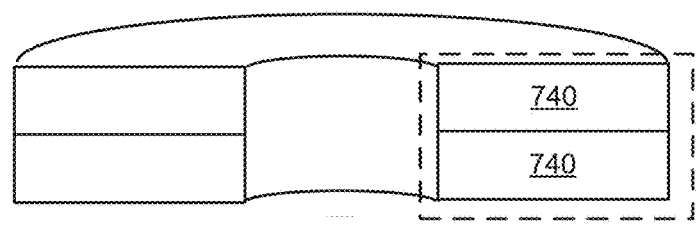
FIG. 7A is a schematic diagram of an HTS solenoidal magnet according to embodiments of the current invention.
Figure 7B:
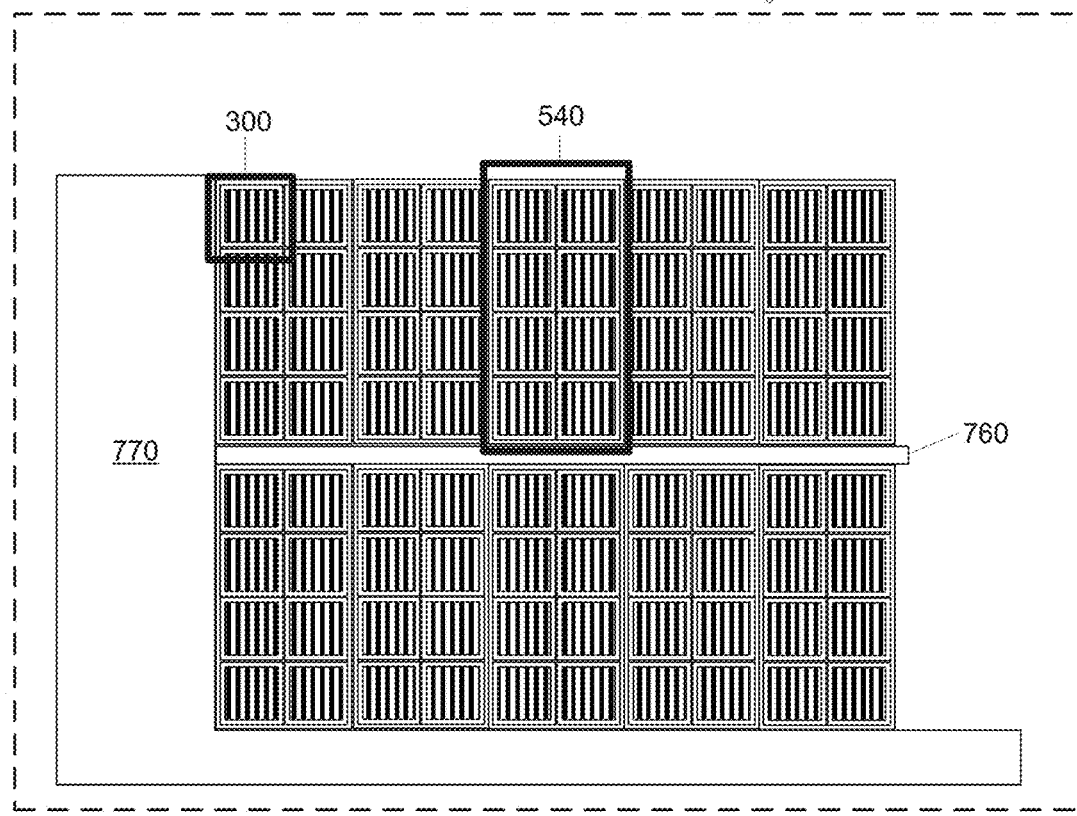
FIG. 7B is a schematic diagram detailing a portion of FIG. 7A showing an example of how a cable assembly may be used to form an HTS solenoidal magnet.

Under the fourth embodiment, the solenoidal magnet may be formed using layer one winding or pancake (or double pancake) winding. Techniques for winding a solenoid for a superconducting magnet include one layer winding of horizontal coils, and pancake (or double pancake) winding. As shown in FIGS. 7A and 7B, a double pancake may include two pancakes 740 stacked together. The double pancake 700 is shown with each pancake 740 having a 4×2 cable assembly 540 wound in layers around a bobbin 770. The double pancake 700 includes an insulating layer 760 located between the first pancake 740 and the second pancake 740, for example, G10 insulation. Additionally, a layer of insulation may be located between adjacent double pancakes, for example, G10 insulation. Adjacent double pancakes are electrically connected, for example, at the outer diameter of each adjacent double pancake. These electrical connections may not be superconducting joints, for example solder joints within a copper enclosure or with a joint summarized in FIG. 9 and outlined in FIG. 10.

Figure 7C:
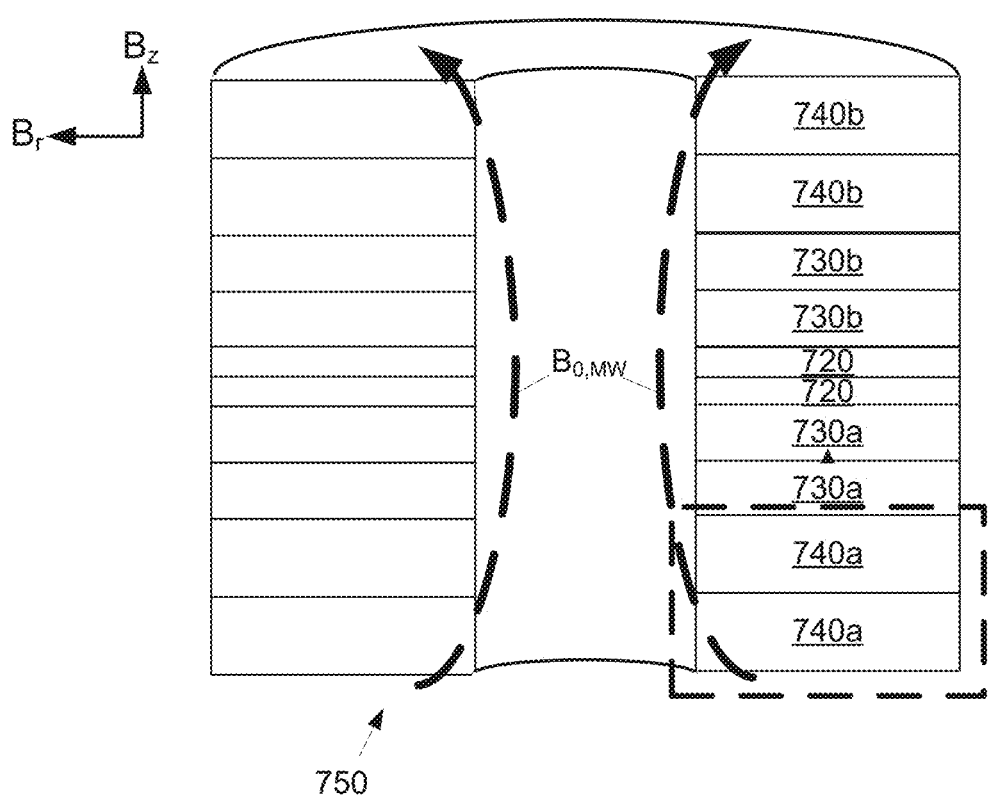
FIG. 7C is a schematic diagram of a multi-width HTS solenoidal magnet.

Under a fifth exemplary embodiment of the current invention, a multi-width, high-temperature superconducting magnet 750 includes coils formed of cable subassemblies 300 (FIG. 3), cable assemblies 400 (FIG. 4), 600 (FIG. 6A) and/or compound cable assemblies (FIG. 9A-9E). FIG. 7C shows a cross section of a superconducting magnet solenoid 750. The magnetic field B has an axial component $B_z$ and a radial component $B_r$. The magnetic field B consists mostly of an axial component at the center portion of the double-pancake magnet 700. Toward the top and bottom of the solenoidal magnet 750, the magnetic field, respectively, diverges and converges, producing a more radially directed magnetic field. Since the tape 310 (FIG. 3) used to form the cables for the magnet 750 is anisotropic, it does not respond well to a broad field impinging on the surface of the tape 310 (FIG. 3). Therefore, the end portions of the solenoid 750 cannot carry as much current density as the central portion of the solenoidal magnet, and the current-carrying capacity of the magnet 750 is effectively limited by the current-carrying capacity of the portions of the magnet at the top and bottom.

As mentioned above, the amount of current passing through the magnet 750 may be limited by the current-carrying capacity of the coils 740a, 740b at the top and bottom of the magnet 750. Therefore, it may be desirable to form a magnet having a greater current-carrying capacity at the top and bottom of the magnet 750 than toward the center of the magnet 750. By using double pancake coils of differing widths, narrower coils 720 of lower current-carrying capacity may be used at the center of the magnet 750, and wider coils 740a-b of higher current-carrying capacity may be used at the top and bottom of the magnet 700. This arrangement may also be used to improve the magnetic field density toward the center of the magnet 750. In addition, since the materials used to form the coils are expensive, using smaller coils at the center of a multi-width magnet 750 uses less material than a constant width magnet providing similar capacity, therefore providing cost advantages.

The magnet 750 of the fifth embodiment may be formed using magnets of different current-carrying capacities, for example, double pancake magnets 720, 730a-b, 740a-b. The cable assemblies used to form the double pancake magnets 720, 730a-b, 740a-b may include two, three, four, or more double pancakes magnets of $m \times n_1$, $m \times n_2$, $m \times n_3$, cable subassemblies 610, 612, 613, 614, 620 (FIGS. 6A-6F) and so forth, such that each adjacent double pancake magnet has a different number of cable subassemblies 610, 612, 613, 614, 620 (FIGS. 6A-6F). While it may be desirable for the number of cable subassemblies 610, 612, 613, 614, 620 (FIGS. 6A-6F) to differ by 1 or 2 in adjacent double pancake magnets, there is no objection to embodiments where adjacent double pancake magnets differ by other values of n. For example, the magnet 750 may have a first double pancake magnet 740a formed of m×4 cable subassemblies 300 (FIG. 3), a second double pancake magnet 730a of m×3 cable subassemblies 610, 612, 613, 614, 620 (FIGS. 6A-6F), a third double pancake magnet 720 of m×2 cable subassemblies 610, 612, 613, 614, 620 (FIGS. 6A-6F), a fourth double pancake magnet 730b of m×3 cable subassemblies 610, 612, 613, 614, 620 (FIGS. 6A-6F), and a fifth double pancake magnet 740*b* of m×4 cable subassemblies 610, 612, 613, 614, 620 (FIGS. 6A-6F). Multi-width double pancake superconducting magnets are further described in the co-pending U.S. Pat. No. 9,117,578 B2, entitled "No-Insulation Multi-Width Winding for High-Temperature Superconducting Magnets," which is incorporated herein by reference in its entirety.

The exemplary coil configuration shown in the magnet 750 of FIG. 7C is one of many possible such configurations. While only three double pancake coil widths are shown, in alternative embodiments magnets formed of double pancake coils of more or fewer widths may be used. Similarly, while the magnet 750 has a single center double pancake coil 720 of the narrowest proportions, the center portion of alternative magnets may incorporate two or more center double pancake coils 720 of the narrowest proportions.

Figure 8:
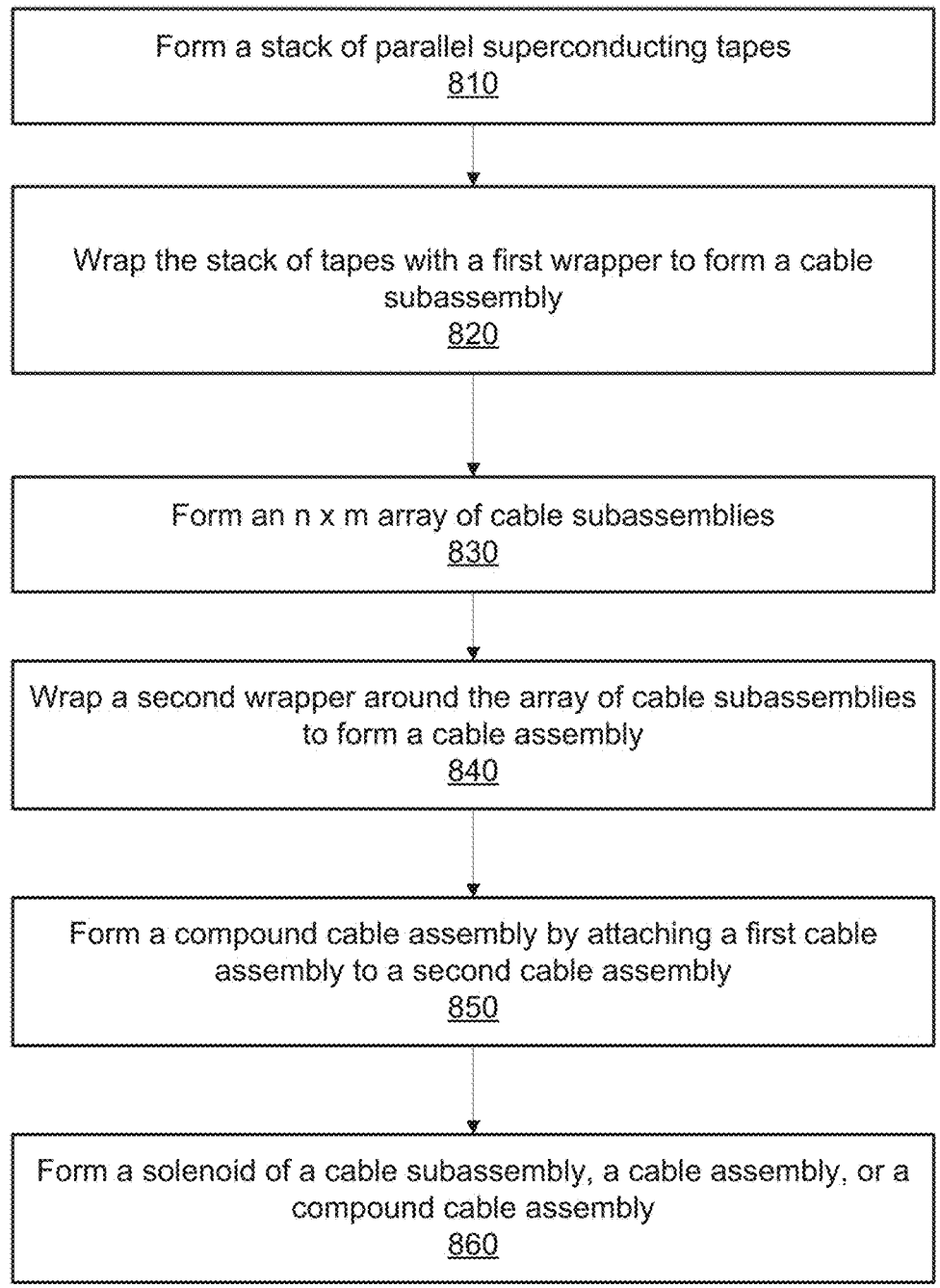
FIG. 8 is a flowchart showing exemplary methods for forming an HTS device.

FIG. 8 is a flowchart 800 showing exemplary methods for manufacturing HTS devices. It should be noted that any process descriptions or blocks in flowcharts should be understood as representing modules, segments, portions of code, or steps that include one or more instructions for implementing specific logical functions in the process, and alternative implementations are included within the scope of the present invention in which functions may be executed out of order from that shown or discussed, including substantially concurrently or in reverse order, depending on the functionality involved, as would be understood by those reasonably skilled in the art of the present invention.

A sixth exemplary embodiment of the current invention is a method for forming an HTS subassembly cable 610, 612, 613, 614, 620 (FIGS. 6A-6F). A stack of parallel superconducting tapes 310 (FIG. 3) is layered, as shown by block 810. The stack of tapes 310 (FIG. 3) is wrapped with a first wrapper 320 (FIG. 3) to form a cable subassembly 610, 612, 613, 614, 620 (FIGS. 6A-6F) as shown by block 820.

A seventh exemplary embodiment of the current invention is a method for forming an HTS assembly cable 400 (FIG. 4). An n×m array of cable subassemblies 610, 612, 613, 614, 620 (FIGS. 6A-6F) is formed, as shown by block 830. A second wrapper 420 (FIG. 4) is wrapped around the array of cable subassemblies to form a cable assembly 400 (FIG. 4), as shown by block 840.

Figure 9A:
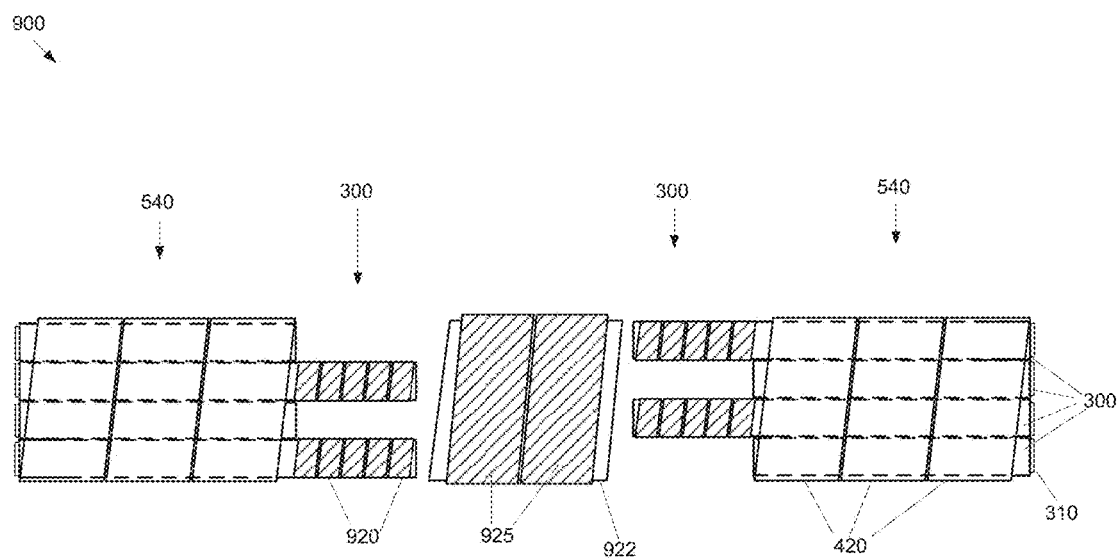
FIG. 9A is a schematic drawing showing an exploded view of an exemplary joint between two 4×2 cable assemblies in a compound cable assembly.
Figure 9B:
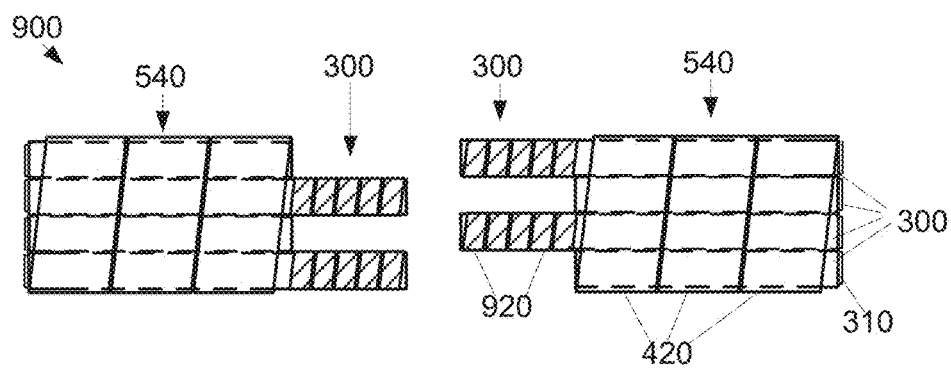
FIG. 9B is a schematic drawing showing a first step for joining two 4×2 cable assemblies.
Figure 9C:
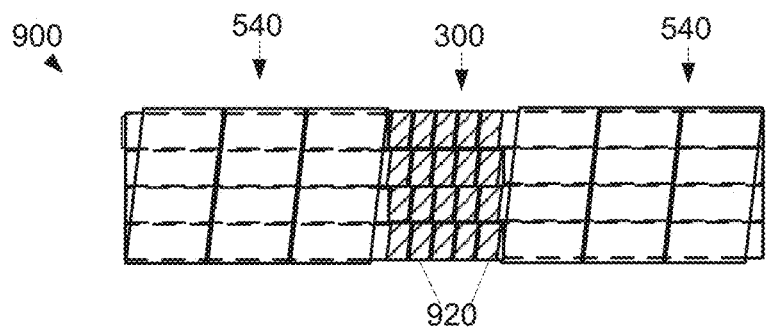
FIG. 9C is a schematic drawing showing a second step for joining two 4×2 cable assemblies.
Figure 9D:
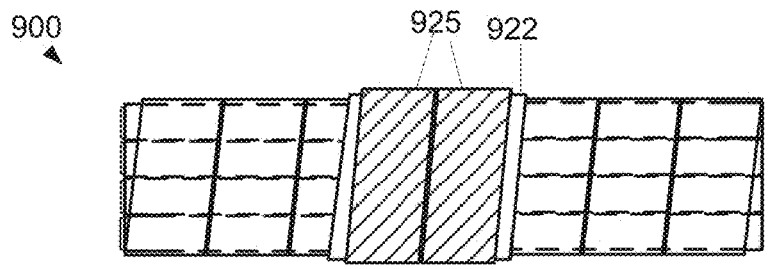
FIG. 9D is a schematic drawing showing a third step for joining two 4×2 cable assemblies.
Figure 9E:
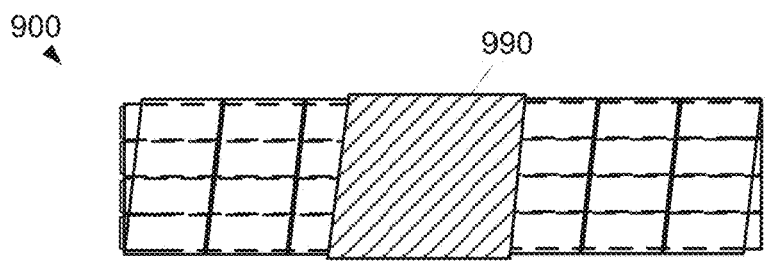
FIG. 9E is a schematic drawing showing a completed joint between two 4×2 cable assemblies.
Figure 10:
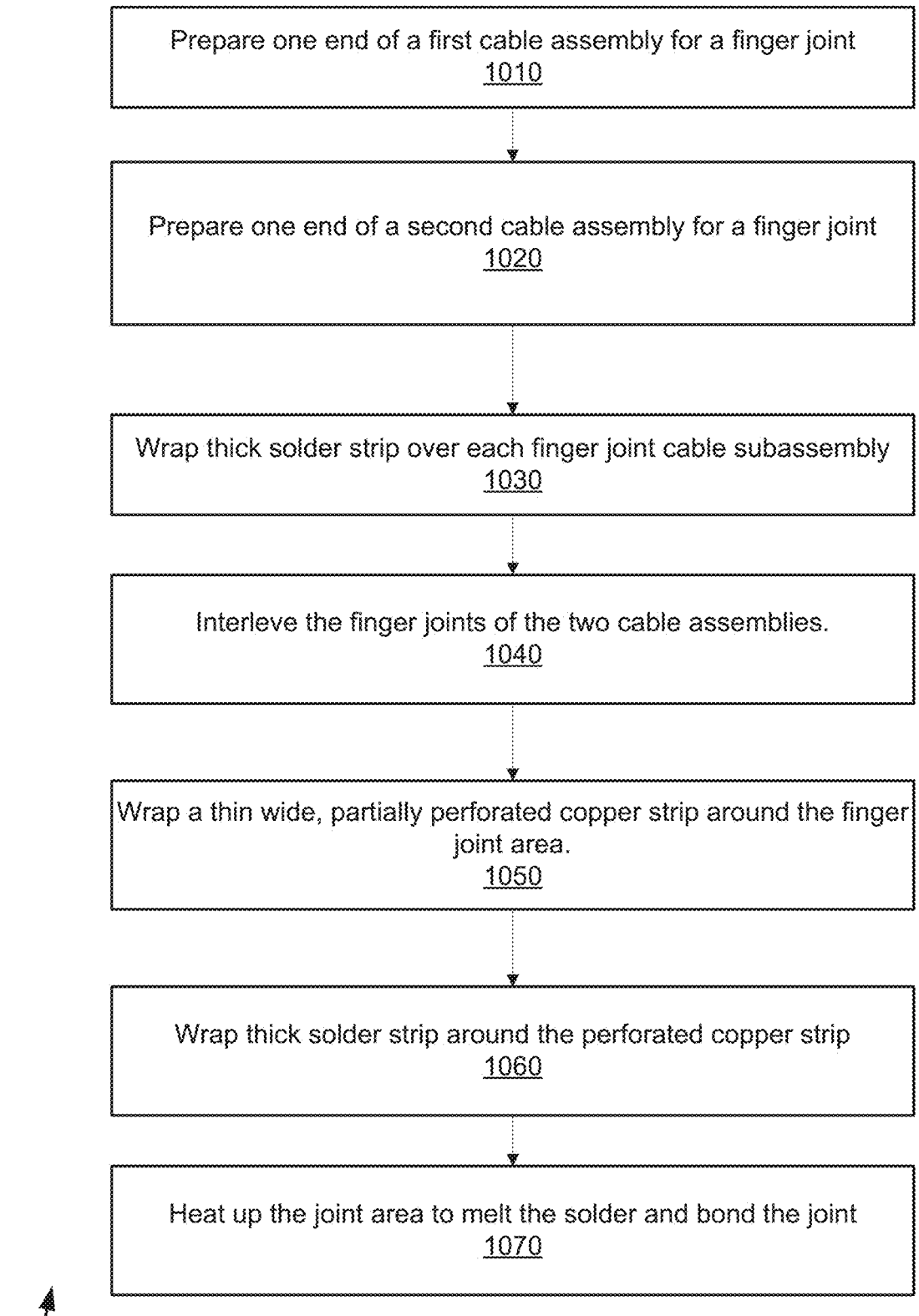
FIG. 10 is a flowchart showing an exemplary method for joining two cable assemblies.

An eighth exemplary embodiment of the current invention is a method for forming an HTS compound cable 900 (FIGS. 9A-9E). A compound cable assembly 900 (FIGS. 9A-9E) may be formed by attaching a first cable assembly 400 (FIG. 4), 600 (FIG. 6A) to a second cable assembly 400 (FIG. 4), as shown by block 850. The first cable assembly 400 (FIG. 4), 600 (FIG. 6A) and the second cable assembly 400 (FIG. 4), 600 (FIG. 6A) may be attached end to end with partial interleaving of subassemblies 300, as shown in FIGS. 9A-9C and described above.

A ninth exemplary embodiment of the current invention is a method for forming an HTS magnet 750 (FIG. 7C). A solenoid is formed of a cable subassembly 610, 612, 613, 614, 620 (FIGS. 6A-6F), a cable assembly 400 (FIG. 4), or a compound cable assembly 900 (FIGS. 9A-9E), as shown by block 860. A solenoidal magnet formed of a cable subassembly 610, 612, 613, 614, 620 (FIGS. 6A-6F) may be wound in either single layer or pancake/double pancake fashion. A solenoidal magnet formed of a compound cable assembly 900 (FIGS. 9A-9E) is preferentially formed as a multi-width magnet having multiple double pancake coils.

In summary it will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A high-temperature superconducting (HTS) device comprising:
    a plurality of cable subassemblies, each with a rectangular cross section having a cable subassembly width and a cable subassembly thickness further comprising:
        a plurality of tapes formed of a superconducting material, each of the plurality of tapes having a tape length, a first face and an opposing second face of a tape width, and a first edge and a second edge having a tape thickness; and
        a cable subassembly wrapper formed of a first non-superconducting material disposed around a stack of the plurality of tapes,
        wherein the plurality of tapes in the stack are slidably arranged face-to-face with aligned first and second edges, the stack of tapes is not substantially twisted around a longitudinal axis of the stack of tapes the stack of tapes having an aggregate thickness substantially equal to the cable subassembly width less the thickness of the cable subassembly wrapper, the tape width being substantially equal to the cable subassembly width less the thickness of the cable subassembly wrapper, and the subassembly wrapper is disposed around the cable subassembly for substantially the length of the cable subassembly; and
    a cable assembly comprising a rectangular n×m array of the plurality of cable subassemblies, wherein each cable subassembly is disposed adjacent to at least one other cable subassembly, n and m are positive integers, the plurality of cable subassemblies is not substantially twisted around a longitudinal axis of the cable assembly, and the cable assembly has an assembly length substantially equal to the cable subassembly length; and
    a cable assembly wrapper formed of a second non-superconducting material disposed around a cable assembly,
    wherein a first cable subassembly of the array of subassemblies is oriented substantially perpendicular to a second cable subassembly with regard to the plurality of tapes.

2. A high-temperature superconducting (HTS) device comprising:
    a compound cable assembly comprising:
        a first cable assembly according to claim 1 comprising an n×m$_1$ array of cable subassemblies; and
        a second cable assembly according to claim 1 comprising an n×m$_2$ array of cable subassemblies,
    wherein the second cable assembly is connected end-to-end with the first cable assembly, and the first cable assembly is in superconducting communication with the second cable assembly.

3. The HTS device of claim 2, wherein m$_1$ is not equal to m$_2$.

4. A high-temperature superconducting magnet comprising a solenoid formed of a compound cable assembly according to claim 2.

5. The high-temperature superconducting magnet according to claim 4, further comprises a plurality of multi-width double pancake coils.

6. The multi-width high-temperature superconducting magnet according to claim 5, further comprising a first double pancake coil formed of the first cable assembly and a second double pancake coil formed of the second cable assembly.

7. The HTS device of claim 1, wherein each of the plurality tapes of at least one cable subassembly further comprises at least two side-by-side tape segments, the combined width of each side-by-side tape segment being substantially the same as the tape width.

8. The HTS device of claim 1, wherein the superconducting material comprises rare-earth barium-copper-oxide (REBCO).

9. The HTS device of claim 1 further comprising an insulating material disposed between two or more tapes of the plurality of tapes.

10. The HTS device of claim 1, wherein the first non-superconducting material comprises a conducting material.

11. The HTS device of claim 1, wherein the first non-superconducting material comprises an insulating material.

12. The HTS device of claim 1, wherein each cable subassembly has a substantially rectangular shaped cross section.

13. The HTS device of claim 1, wherein the second non-superconducting material comprises a conducting material.

14. The HTS device of claim 1, wherein the second non-superconducting material comprises an insulating material.

15. The HTS device of claim 1, wherein the first non-superconducting material is the not the same as the second non-superconducting material.

16. The HTS device of claim 1, wherein m is 2 and n is one of the set consisting of 2-10.

17. The HTS device of claim 1, wherein the plurality of tapes of at least one cable subassembly is configured as a stack of ring-shaped tapes.

18. A high-temperature superconducting (HTS) magnet comprising a solenoid formed of a cable assembly according to claim 1.

19. The high-temperature superconducting magnet according to claim 18, further comprises a plurality of multi-width double pancake coils.

* * * * *